(12) United States Patent
Shimada

(10) Patent No.: US 8,030,599 B2
(45) Date of Patent: Oct. 4, 2011

(54) SUBSTRATE PROCESSING APPARATUS, HEATING DEVICE, AND SEMICONDUCTOR DEVICE MANUFACTURING METHOD

(75) Inventor: Masakazu Shimada, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 246 days.

(21) Appl. No.: 12/429,462

(22) Filed: Apr. 24, 2009

(65) Prior Publication Data

US 2010/0032425 A1  Feb. 11, 2010

(30) Foreign Application Priority Data

Aug. 8, 2008  (JP) ................................. 2008-204968

(51) Int. Cl.
*F27B 5/00* (2006.01)
*F27B 5/08* (2006.01)
*F27B 5/14* (2006.01)
*C23C 16/00* (2006.01)

(52) U.S. Cl. .......................... 219/390; 219/399; 118/724

(58) Field of Classification Search .......................... None
See application file for complete search history.

(56) References Cited

U.S. PATENT DOCUMENTS 6,547,922 B2 * 4/2003 Hori et al. ................. 156/345.37
6,858,087 B2 * 2/2005 Hori et al. ..................... 118/724
2002/0005171 A1 * 1/2002 Hori et al. ..................... 118/724
2003/0136517 A1 * 7/2003 Hori et al. ................. 156/345.37
2009/0064935 A1 * 3/2009 Dauelsberg et al. .......... 118/724
2010/0273320 A1 * 10/2010 Kappeler et al. .............. 438/507

FOREIGN PATENT DOCUMENTS

| JP | 8-69977 | 3/1996 |
| JP | 8-195351 | 7/1996 |
| JP | 3112672 | 9/2000 |
| JP | 2004-311648 | 11/2004 |

* cited by examiner

*Primary Examiner* — Joseph M Pelham

(74) *Attorney, Agent, or Firm* — Brundidge & Stanger, P.C.

(57) ABSTRACT

Provided are a substrate processing apparatus, a heating device, and a semiconductor device manufacturing method. The substrate processing apparatus comprises a process chamber configured to process a substrate. A heating element is installed at a peripheral side of the process chamber. An annular inner wall is installed at a peripheral side of the heating element. An annular outer wall is installed at a peripheral side of the inner wall with a space being formed therebetween. An annular cooling member is installed at the space for cooling. An actuating mechanism moves the cooling member between a contacting position where the cooling member makes contact with at least one of the inner wall and the outer wall and a non-contacting position where the cooling member does not make contact with any one of the inner wall and the outer wall. A control unit controls at least the actuating mechanism.

15 Claims, 12 Drawing Sheets

SUBSTRATE PROCESSING APPARATUS, HEATING DEVICE, AND SEMICONDUCTOR DEVICE MANUFACTURING METHOD

CROSS-REFERENCE TO RELATED PATENT APPLICATION

This U.S. non-provisional patent application claims priority under 35 U.S.C. §119 of Japanese Patent Application No. 2008-204968, filed on Aug. 8, 2008, in the Japanese Patent Office, the entire contents of which are hereby incorporated by reference.

BACKGROUND OF THE INVENTION

1. Field of the Invention

The present invention relates to a substrate processing apparatus, a heating device, and a semiconductor device manufacturing method.

2. Description of the Prior Art

A conventional substrate processing apparatus (refer to Patent Document 1) includes a process chamber configured to process a substrate and a heater unit configured to heat the process chamber. The heater unit includes a heating element installed around the process chamber, a first reflector installed around the heating element, a second reflector installed around the first reflector with a space being formed therebetween, an exhaust pipe configured to exhaust the space between the first and second reflectors, and a supply pipe configured to supply gas to the space.

[Patent Document 1] Japanese Unexamined Patent Application Publication No. 2004-311648

However, such a conventional substrate processing apparatus is disadvantageous in that it takes time to cool the inside of a process chamber.

SUMMARY OF THE INVENTION

An object of the present invention is to provide a substrate processing apparatus, a heating device, and a semiconductor device manufacturing method that are designed for rapidly cooling the inside of a process chamber.

According to an aspect of the present invention, there is provided a substrate processing apparatus comprising: a process chamber configured to process a substrate; a heating element heating the process chamber, the heating element provided to surround the process chamber; an inner wall provided to surround the heating element; an outer wall provided to surround the inner wall; a cooling member disposed in a space between the inner wall and the outer wall; an actuating mechanism configured to move the cooling member between a contacting position and a non-contacting position wherein the cooling member is in contact with at least one of the inner wall and the outer wall at the contacting position and the cooling member is without contact with any of the inner wall and the outer wall at the non-contacting position; and a control unit configured to control at least the actuating mechanism.

According to another aspect of the present invention, there is provided a heating device comprising: a heating element heating a process chamber, the heating element provided to surround the process chamber; an inner wall provided to surround the heating element; an outer wall provided to surround the inner wall; a cooling member disposed in a space between the inner wall and the outer wall; an actuating mechanism configured to move the cooling member between a contacting position where the cooling member is in contact with the inner wall and a contacting position wherein the cooling member is in contact with the outer wall.

According to another aspect of the present invention, there is provided a method of manufacturing a semiconductor device, comprising: moving an cooling member disposed in a space between an inner wall provided to surround a heating element heating a process chamber and an outer wall provided to surround the inner wall using an actuating mechanism, the actuating mechanism being configured to move the cooling member between a contacting position and a non-contacting position wherein the cooling member is in contact with at least one of the inner wall and the outer wall at the contacting position and the cooling member is without contact to with any of the inner wall and the outer wall at the non-contacting position; and processing a substrate in the process chamber.

BRIEF DESCRIPTION OF THE DRAWINGS

FIG. 3A is a perspective view illustrating a first example of the water-cooling jacket, and FIG. 3B is a perspective view illustrating a second example of the water-cooling jacket.

FIG. 5A is an enlarged sectional view illustrating portion A enclosed by a dashed line in FIG. 4, and FIG. 5B is a sectional view taken along line B-B of FIG. 4.

FIG. 10A is a sectional view, and FIG. 10B is a view taken in the direction of line C-C in FIG. 10A.

DETAILED DESCRIPTION OF THE PREFERRED EMBODIMENTS

Embodiments of the present invention will be described hereinafter with reference to the attached drawings.

Figure 1:
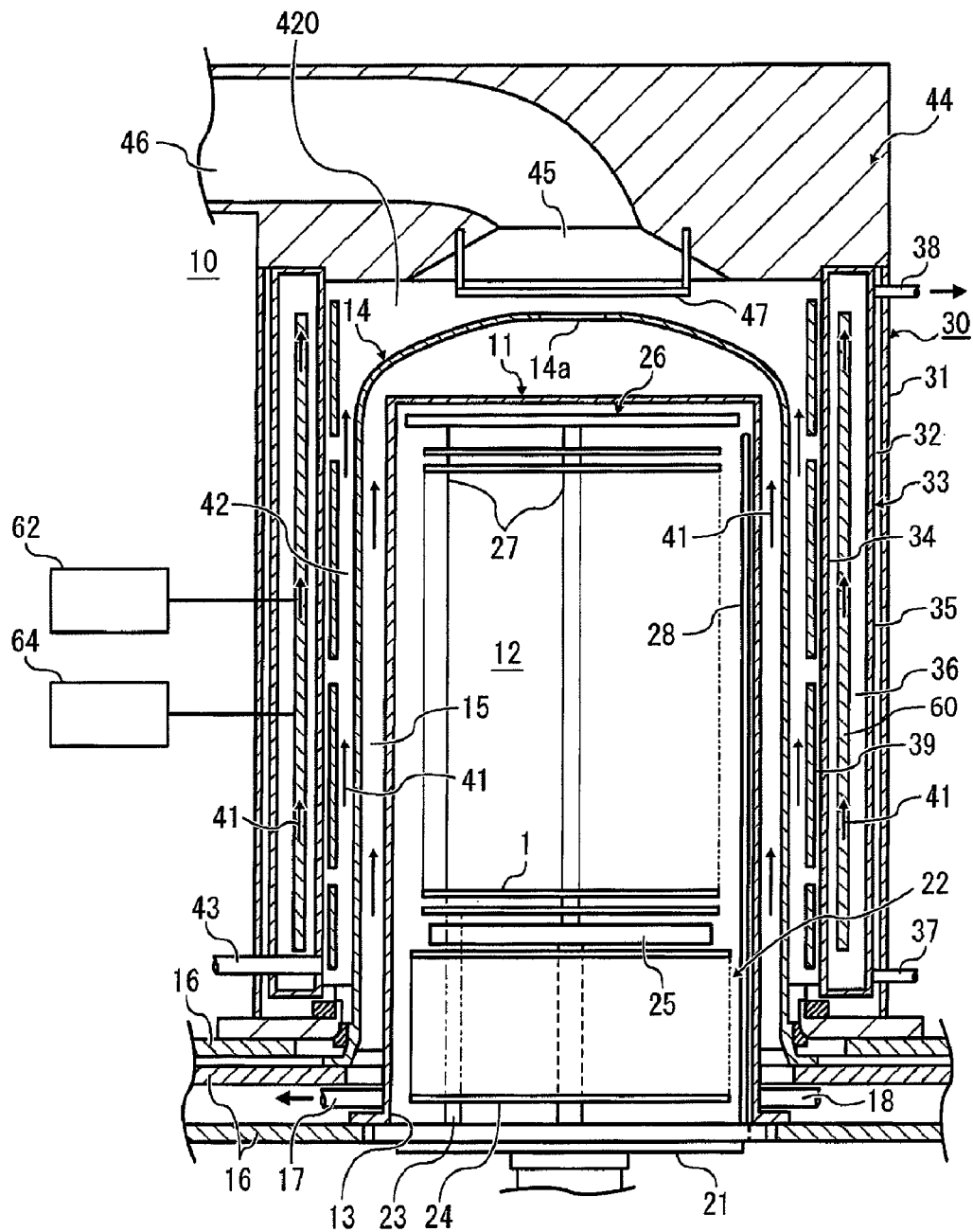
FIG. 1 is a schematic side sectional view illustrating a substrate processing apparatus according to a first embodiment of the present invention.
Figure 2:
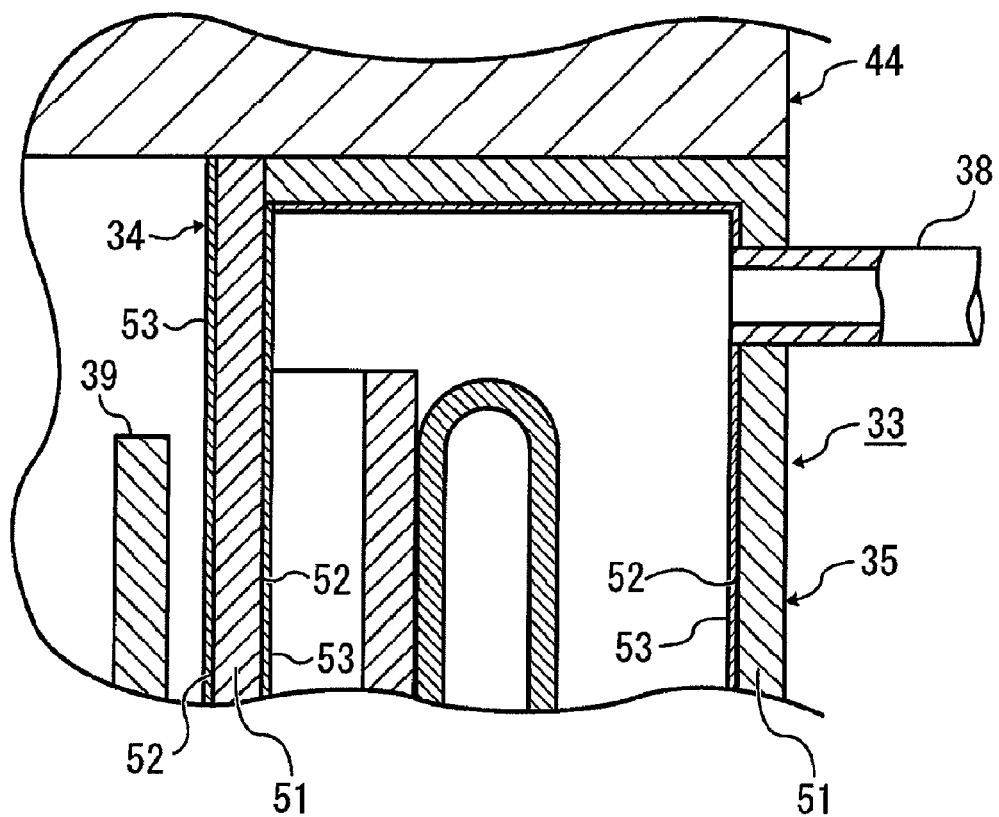
FIG. 2 is an enlarged sectional view illustrating a part of the substrate processing apparatus according to the first embodiment of the present invention.

FIG. 1 and FIG. 2 illustrate a substrate processing apparatus 10 according to a first embodiment of the present invention. The substrate processing apparatus 10 is a batch type vertical hot-wall oxidation diffusion apparatus.

The substrate processing apparatus 10 includes a vertical process tube 11, which is fixedly supported with its longitudinal center line being vertical. The process tube 11 is made of quartz ($SiO_2$) and has a cylindrical shape with a closed top side and an opened bottom side.

A hollow part of the process tube 11 forms a process chamber 12 configured to process wafers 1 used as substrates. In the process chamber 12, a plurality of wafers 1 can be processed together. An opening formed in the bottom side of the process tube 11 is used as a furnace port 13. Wafers 1 are carried into and out of the process chamber 12 through the furnace port 13.

At the outside of the process tube 11, a uniform heat tube 14 is installed to cover the process tube 11. The uniform heat tube 14 is made of a material such as silicon carbide and is closed at its top side and opened at its bottom side. The uniform heat tube 14 has a cylindrical shape and is larger than the process tube 11. An air hole 14a is installed at a top wall of the uniform heat tube 14.

Between the process tube 11 and the uniform heat tube 14, an air passage 15 is formed in a donut shape to allow flows of coolant such as clean air. Clean air is discharged from the air passage 15 through the air hole 14a. Alternatively, the air hole 14a may be not installed.

In addition, the substrate processing apparatus 10 includes a housing 16. The housing 16 supports the process tube 11 and the uniform heat tube 14 in the gravity direction from the bottom sides of the process tube 11 and uniform heat tube 14.

In addition, the substrate processing apparatus 10 includes an exhaust pipe 17. An end part of the exhaust pipe 17 is connected to a lower end part of the sidewall of the process tube 11. The other end part of the exhaust pipe 17 is connected to an exhaust device (not shown). The exhaust device is used to keep the process chamber 12 at a predetermined pressure by exhausting the process chamber 12.

In addition, the substrate processing apparatus 10 includes a gas introducing pipe 18. The gas introducing pipe 18 is installed at a position of the process tube 11 different from the position where the exhaust pipe 17 is installed.

At the downside of the process tube 11, a seal cap 21 is installed. The seal cap 21 is disk-shaped and configured to be moved upward and downward by a boat elevator (not shown) along a line extending from the centerline of the process tube 11.

At the upside of the seal cap 21, an insulating cap 22 is installed. The insulating cap 22 is used to insulate the vicinity of the furnace port 3 of the process tube 11. The insulating cap 22 is configured such that a plurality of insulating plates 24 can be held by a plurality of holding members 23 in a horizontally oriented state with the centers of the insulating plates 24 being aligned.

Above the insulating cap 22, a disk-shaped sub heater unit 25 is horizontally installed coaxial with the insulating cap 22. A boat 26 is vertically erected on the sub heater unit 25. The boat 26 is configured such that a plurality of wafers 1 can be held by a plurality of holding members 27 in a horizontally oriented state with the centers of the wafers 1 being aligned. A temperature sensor 28 is vertically inserted through the seal cap 21 as a temperature detector for detecting the inside temperature of the process chamber 12.

At the outside of the uniform heat tube 14, a heater unit 30 is installed to cover the uniform heat tube 14 entirely. The heater unit 30 is vertically supported by the housing 16. The heater unit 30 includes a cylindrical case 31 made of a material such as a thin steel plate, and an insulating material 32 such as ceramic fiber is applied to the inner peripheral surface of the case 31 to a thin thickness.

Inside the insulating material 32, an insulating vessel 33 having a so-called thermos bottle structure is installed coaxial with the insulating material 32. The insulating vessel 33 includes an inner wall 34 and an outer wall 35.

The inner wall 34 is an annular inner wall installed at the outer periphery of a heater (heating element) 39 (described later), and the inner wall 34 has a cylindrical shape having an inner diameter greater than the outer diameter of the uniform heat tube 14. The outer wall 35 is an annular outer wall installed coaxial with the inner wall 34 to form a space 36 from the outer periphery of the inner wall 34, and the outer wall 35 has a cylindrical shape greater than the inner wall 34. The inner wall 34 forms a heating space 420.

The inner wall 34 and the outer wall 35 have bodies made of a heat-resistant material such as metal, ceramic, and insulator, and the surfaces of the bodies are mirror-finished by a method such as electrolytic polishing. Preferably, reflective coating films formed of silicon oxide ($SiO_2$), silicon nitride (SiN), or multiple coating layers of silicon oxide ($SiO_2$) and silicon nitride (SiN) are coated on the bodies of the inner wall 34 and the outer wall 35 to increase the reflectance of the inner wall 34 and the outer wall 35.

It is preferable that the inner wall 34 and the outer wall 35 be made of the same material as that used for making the heater 39 (described later in detail). In this case, the heat-resistant characteristics and other thermal characteristics of the inner wall 34 and the outer wall 35 can be the same as those of the heater 39 used as a heat source. In the case where the inner wall 34 and the heater 39 are made of the same material, it is preferable that an insulating material be used between the inner wall 34 and the heater 39 to electrically isolate the inner wall 34 and the heater 39 from each other.

The space 36 is a gap formed between the outer periphery of the inner wall 34 and the inner periphery of the outer wall 35 by disposing the inner wall 34 and the outer wall 35 coaxial with each other.

A supply pipe 37 and an exhaust pipe 38 are respectively connected to the upstream and downstream end parts of the space 36 for circulating a cooling medium such as gaseous air (clean air) or nitrogen gas (inert gas).

Preferably, the space 36 may be air-tightly sealed for being used as an air insulating part. For example, it is preferable that a closing structure formed of a part such as a cover be installed at, for example, an upper end part of the space 36 so as to close the space 36 during a normal operation and open the cover using a pressure difference between the inside and outside of the space 36 when the inside of the space 36 is cooled. In this case, the space 36 can be rapidly cooled. Alternatively, the closing structure such as the cover may be closed and opened by a driving force transmitted from a driving source. In this case, an actuating mechanism 64 (described later) may be switched for being used as the driving source, or an additional unit may be used as the driving source.

Inside the inner wall 34, the heater 39 is installed as a heating element for heating the process chamber 12. The heater 39 is made of a material such as molybdenum disilcide ($MoSi_2$) and is installed coaxially with the uniform heat tube 14 to surround the uniform heat tube 14. Instead of molybdenum disilcide ($MoSi_2$), the heater 39 may be made of a metallic heating element material or carbon.

In addition, the heater 39 is divided into a plurality of heater parts in a vertical direction, and the heater parts are connected to a temperature controller (not shown) so that the heater parts can be individually sequence-controlled in association with each other.

In addition, a post-shaped heater having a circular or elliptical cross-section, or a planar patterned heater may be used as the heater 39. If the heater 39 is densely disposed to increase the surface area of the heater 39, wafers 1 can be rapidly heated owing to the increased surface area. In addition, since heat dissipation is high at the upper and lower parts of the process chamber 12 than other parts of the process chamber 12, if the heater 39 is disposed more densely at the upper and lower parts of the process chamber 12 than at other parts of the process chamber 12, the process chamber 12 can be uniformly heated.

Between the insulating vessel 33 and the uniform heat tube 14, a cooling air passage 42 is formed to surround the uniform heat tube 14 entirely and circulate cooling air 41 therethrough.

In addition, an air supply pipe 43 is connected to the lower end part of the insulating vessel 33 to supply cooling air 41 to the cooling air passage 42. Cooling air 41 supplied to the air supply pipe 43 spreads through the cooling air passage 42.

In addition, the upper side of the insulating vessel 33 is covered with a cover 44 made of a material such as an insulating material, and an exhaust hole 45 is formed at the center part of the cover 44. The exhaust hole 45 is connected to an exhaust passage 46. A sub heater unit 47 is installed at a position facing the exhaust hole 45.

In the space 36, a water-cooling jacket 60 is installed as a cooling member. For example, the water-cooling jacket 60 is an annular cooling member that can be forcibly cooled, and the water-cooling jacket 60 has a cylindrical shape coaxial with the inner wall 34 and the outer wall 35.

A water-cooling device 62 is connected to the water-cooling jacket 60 for cooling the water-cooling jacket 60 using water, and the actuating mechanism 64 is connected to the water-cooling jacket 60 for moving the water-cooling jacket 60.

The actuating mechanism 64 moves the water-cooling jacket 60 between a contacting position where the water-cooling jacket 60 makes contact with at least one of the inner wall 34 and the outer wall 35 and a non-contacting position where the water-cooling jacket 60 does not make contact with any one of the inner wall 34 and the outer wall 35. In FIG. 1 and FIG. 2, the water-cooling jacket 60 is placed in a non-contacting position where the water-cooling jacket 60 does not makes contact with the inner wall 34 and the outer wall 35.

When the water-cooling jacket 60 makes contact with the inner wall 34, heat transfers from the inner wall 34 to the water-cooling jacket 60 because the temperature of the water-cooling jacket 60 is lower than the temperature of the inner wall 34, so that the inner wall 34 can be cooled. In addition, when the water-cooling jacket 60 makes contact with the outer wall 35, heat transfers from the outer wall 35 to the water-cooling jacket 60 because the temperature of the water-cooling jacket 60 is lower than the temperature of the outer wall 35, so that the outer wall 35 can be cooled.

Figure 3A:
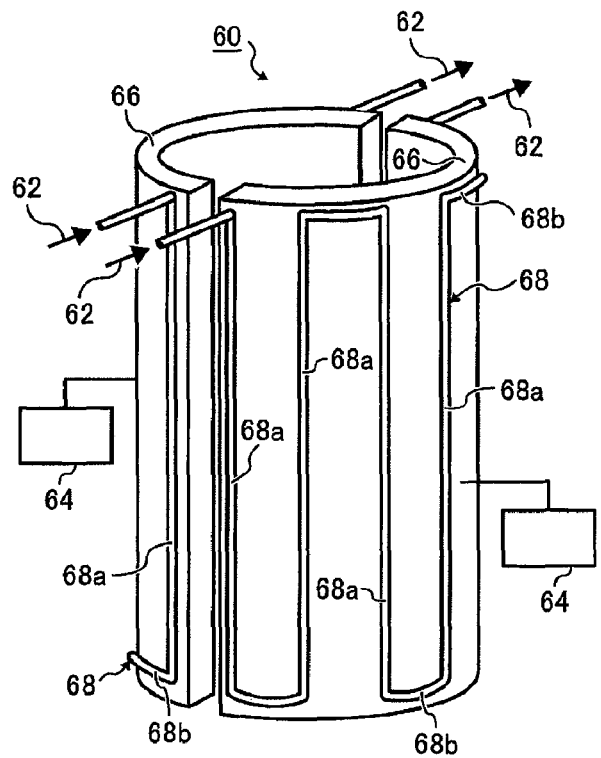
FIG. 3A and FIG. 3B illustrate examples of a water-cooling jacket of the substrate processing apparatus according to the first embodiment of the present invention.

FIG. 3A illustrates a first example of the water-cooling jacket 60.

As shown in FIG. 3A, the first example of the water-cooling jacket 60 includes two jacket main bodies 66. Each of the two jacket main bodies 66 has a semi-cylindrical shape so that a cylindrical shape can be formed by bringing end parts of the two jacket main bodies 66 into contact with each other. Furthermore, actuating mechanisms 64 are connected to the jacket main bodies 66, respectively.

Preferably, in a state where the water-cooling jacket 60 is in contact with the inner wall 34, the ends parts of the water-cooling jacket 60 may make contact with each other. In this case, the inner wall 34, which is usually heated to a higher temperature than the outer wall 35 and may exert more influence on the temperature of a substrate than the outer wall 35, can be cooled uniformly and efficiently.

At the surfaces of the jacket main bodies 66 facing the outer wall 35 (refer to FIG. 1), pipes 68 are respectively installed. Each of the pipes 68 includes long parts 68a extending in the longitudinal direction of the jacket main body 66, and connection parts 68b connecting the neighboring pairs of the long parts 68a. Water is supplied from the above-described water-cooling device 62 to ends of the pipes 68, and the water returns to the water-cooling device 62 through the other ends of the pipes 68.

Figure 3B:
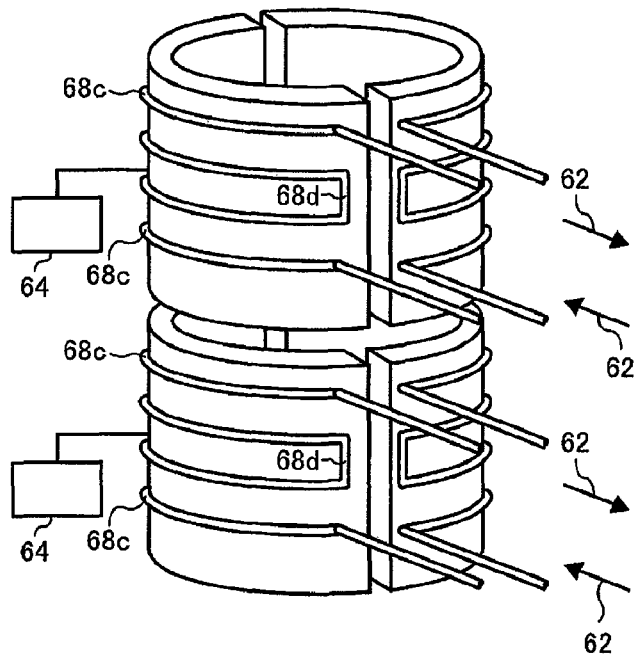

FIG. 3B illustrates a second example of the water-cooling jacket 60.

In the above-described first example, each of the jacket main bodies 66 has a semi-cylindrical shape; in the second example, the jacket main bodies 66 are divided into upper and lower parts. Furthermore, in the second example, each pipe 68 includes circumferential parts 68c extending along the circumferential direction of the jacket main body 66, and connection parts 68d connecting the neighboring pairs of the circumferential parts 68c.

In the first and second examples, two pipes 68 respectively connected to two jacket main bodies 66 are not connected to each other; however, the two pipes 68 can be connected to each other by using an extendable flexible tube for allowing flow of cooling water therethrough.

Furthermore, in the first and second examples, the pipes 68 may be installed around the jacket main bodies 66 in a spiral shape. Furthermore, in the above-described embodiments, as a cooling medium, water is circulated through the pipes 68 using the water-cooling device 62 so as to cool the inner wall 34 and the outer wall 35; however, instead of using water, any other liquid or gas may be used as a cooling medium to cool the inner wall 34 and the outer wall 35. However, liquid may be preferred as a cooling medium than gas. The cooling efficiency is relatively high when liquid is used as a cooling medium as compared with the case of using gas as a cooling medium.

Furthermore, although the pipes 68 are installed at the outer circumferences of the jacket main bodies 66 in the first and second examples, the pipes 68 may be installed at the inner circumferences of the jacket main bodies 66. Preferably, the pipes 68 may be installed at both the inner and outer circumferences of the jacket main bodies 66 to increase the cooling efficiency.

In addition, instead of installing the pipe 68 at least one of the inner and outer circumferences of the jacket main body 66, a flow passage may be formed in the jacket main body 66 for allowing flow of a cooling medium through. In this case, the jacket main body 66 may be formed in a two-layer structure (blocked structure), and the flow passage may be formed between the two layers.

In the case where the pipe 68 is installed, only the pipe 68 may make contact with the outer wall 35 or the outer wall 35, and the jacket main body 66 may not make contact with the jacket main body 66. However, in the case where a flow passage is formed in the jacket main body 66 for allowing flow of a cooling medium, the jacket main body 66 may surely be brought into contact with the outer wall 35 or the inner wall 34 for ensuring a large contact area therebetween.

Figure 4:
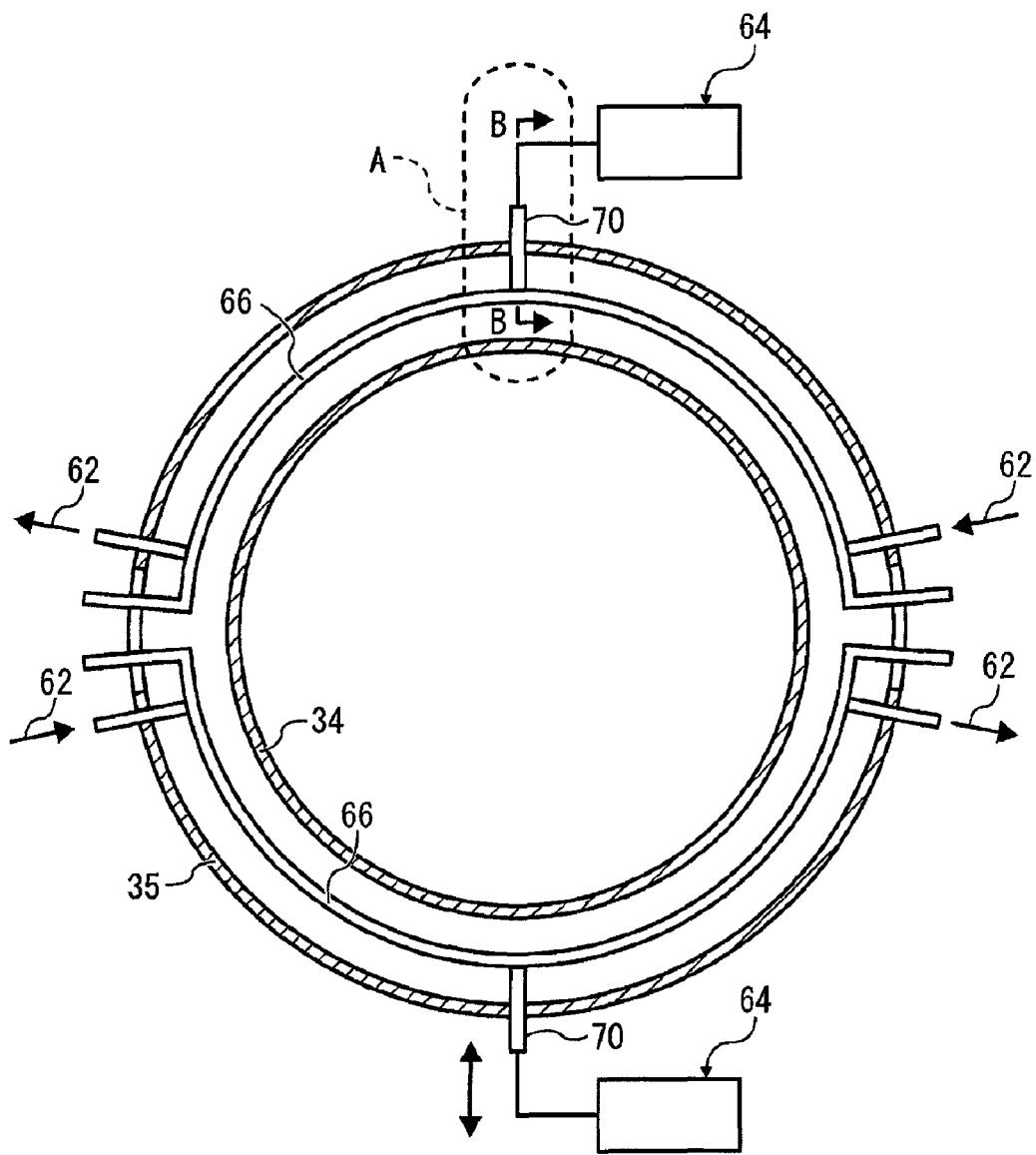
FIG. 4 is a sectional view illustrating actuating mechanisms of the substrate processing apparatus according to the first embodiment of the present invention.
Figure 5A:
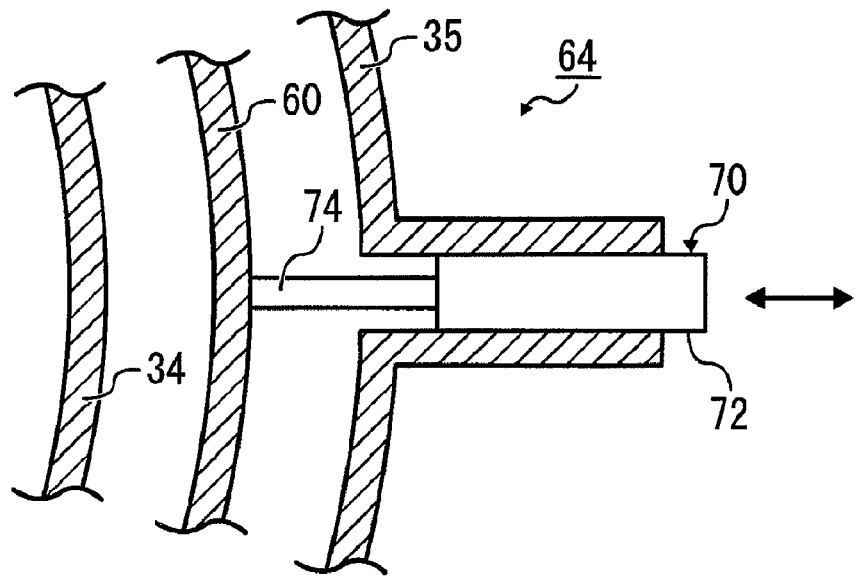
FIG. 5A and FIG. 5B are enlarged view illustrating the actuating mechanism of the substrate processing apparatus according to the first embodiment of the present invention.
Figure 5B:
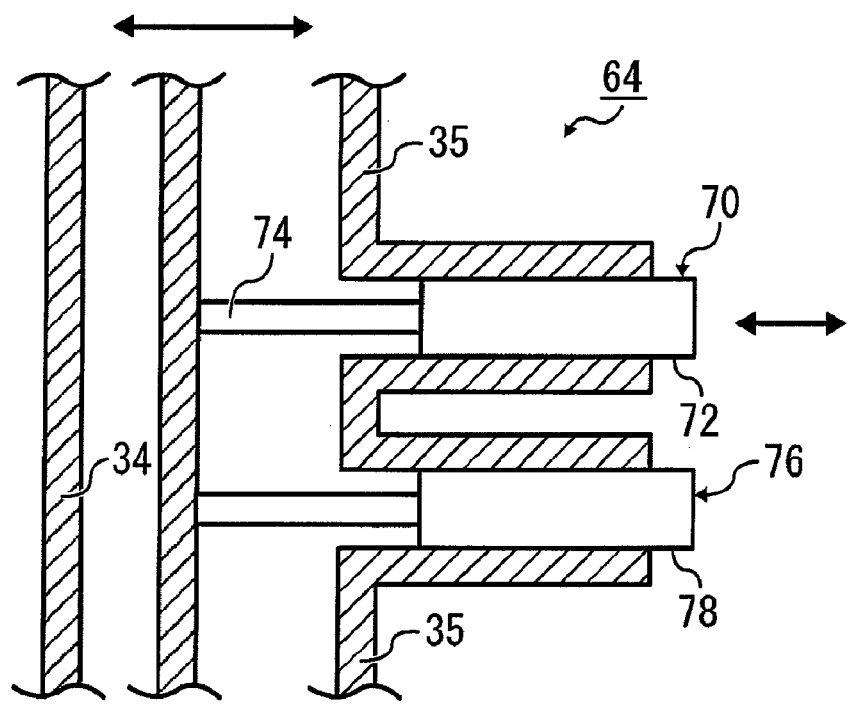

FIG. 4, FIG. 5A, and FIG. 5B illustrate the actuating mechanisms 64.

Each of the actuating mechanisms 64 includes an air cylinder 70 as a driving source for moving the jacket main body 66. The air cylinder 70 includes a cylinder main body 72 fixed to the outer wall 35 and a movable part 74 mounted on the cylinder main body 72 in a manner such that the protruded length of the movable part 74 can be varied. In addition, the actuating mechanism 64 further includes a support mechanism 76 configured to support the jacket main body 66 movably. The support mechanism 76 includes a slidable member 78 that can be slid on the outer wall 35, and an end part of the slidable member 78 is connected to the jacket main body 66.

Owing to the above-described actuating mechanism 64, the water-cooling jacket 60 supported by the slidable member 78 can be moved by operating the air cylinder 70 among a position contacting the inner wall 34, a position contacting the outer wall 35, and a position where the water-cooling jacket 60 does not make contact with any one of the inner wall 34 and the outer wall 35.

In the above embodiment, the water-cooling jacket 60 is moved using the air cylinder 70; however, instead of using the air cylinder 70, other devices such as an electric cylinder may be used to move the water-cooling jacket 60. In addition, instead of using the air cylinder 70, other devices such as a motor or a ball screw may be used to move the water-cooling jacket 60. In the case where an electric cylinder, a motor, or a ball screw is used, it is preferable that the support mechanism 76 be used like the case where the air cylinder 70 is used.

Furthermore, although the water-cooling jacket 60 includes two jacket main bodies 66 in the above embodiment, the water-cooling jacket 60 may include three or more jacket main bodies.

Figure 6:
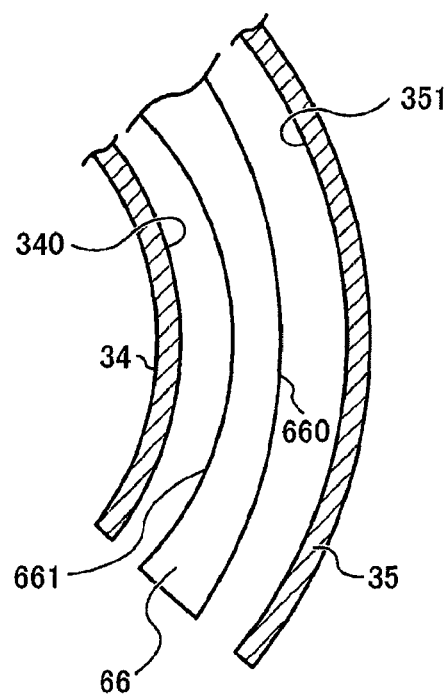
FIG. 6 is a sectional view illustrating exemplary shapes of an inner wall, an outer wall, and a jacket main body of the substrate processing apparatus according to the first embodiment of the present invention.

FIG. 6 illustrates exemplary shapes of the inner wall 34, the outer wall 35, and the jacket main body 66.

An inner surface 661 of the jacket main body 66 (that is, a surface of the jacket main body 66 facing the inner wall 34) has the same curvature as the curvature of an outer surface 340 of the inner wall 34 (that is, a surface of the inner wall 34 facing the jacket main body 66. Therefore, the inner surface 661 of the jacket main body 66 can be brought into contact with the outer surface 340 of the inner wall 34 without any gap.

In addition, an outer surface 660 of the jacket main body 66 (that is, a surface of the jacket main body 66 facing the outer wall 35) has the same curvature as the curvature of an inner surface 351 of the outer wall 35 (that is, a surface of the outer wall 35 facing the jacket main body 66). Therefore, for example, when a cooling water flow passage is formed in the jacket main body 66, the outer surface 660 of the jacket main body 66 can be brought into contact with the inner surface 351 of the outer wall 35 without any gap.

Figure 7:
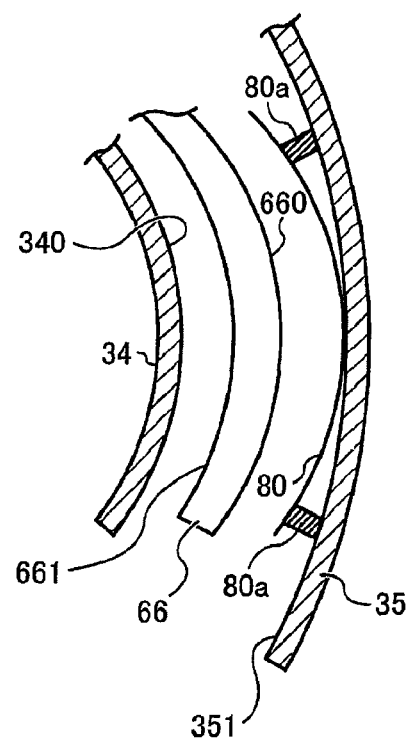
FIG. 7 is a sectional view illustrating first modified shapes of the inner wall, the outer wall, and the jacket main body of the substrate processing apparatus according to the first embodiment of the present invention.

FIG. 7 illustrates first modified shapes of the inner wall 34, the outer wall 35, and the jacket main body 66.

In this modification, as described above, the inner surface 661 of the jacket main body 66 has the same curvature as the curvature of the outer surface 340 of the inner wall 34. Therefore, the inner surface 661 of the jacket main body 66 can be brought into contact with the outer surface 340 of the inner wall 34 without any gap.

In addition, the outer surface 660 and the inner surface 661 of the jacket main body 66 have the same curvature. The curvature of the inner surface 351 of the outer wall 35 is larger than the curvature of the outer surface 660 of the jacket main body 66, thereby causing a gap to be formed between the inner surface 351 of the outer wall 35 and the outer surface 660 of the jacket main body 66.

Therefore, in the first modification, a plate 80 having the same curvature as that of the outer surface 660 of the jacket main body 66 is installed at the inner surface 351 of the outer wall 35. In addition, heat-conductive connection members 80a are installed between the plate 80 and the inner surface 351 of the outer wall 35, such that the jacket main body 66 can be brought into contact with the plate 80 without any gap, and heat conduction can be facilitated.

Figure 8:
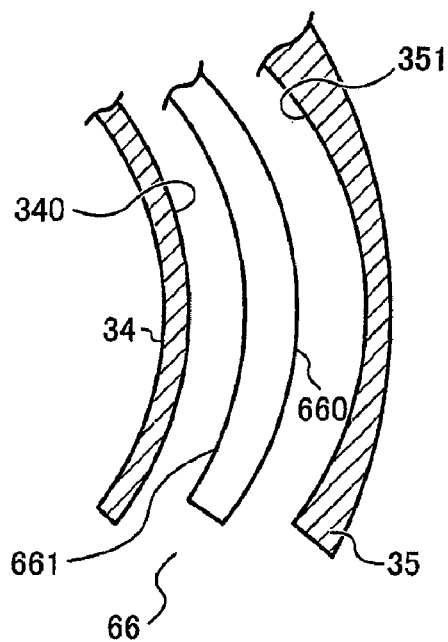
FIG. 8 is a sectional view illustrating second modified shapes of the inner wall, the outer wall, and the jacket main body of the substrate processing apparatus according to the first embodiment of the present invention.

FIG. 8 illustrates second modified shapes of the inner wall 34, the outer wall 35, and the jacket main body 66.

In this modification, as described above, the inner surface 661 of the jacket main body 66 has the same curvature as the outer surface 340 of the inner wall 34. Therefore, the inner surface 661 of the jacket main body 66 can be brought into contact with the outer surface 340 of the inner wall 34 without any gap.

In addition, the outer surface 660 and the inner surface 661 of the jacket main body 66 have the same curvature, and the inner surface 351 of the outer wall 35 has the same curvature as the inner surface 661 of the jacket main body 66. Therefore, the outer surface 660 of the jacket main body 66 can be brought into contact with the inner surface 351 of the outer wall 35 without any gap.

Figure 9:
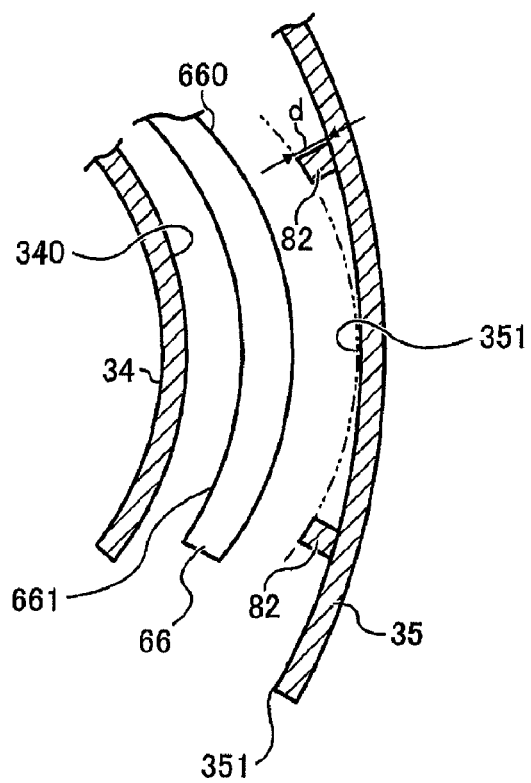
FIG. 9 is a sectional view illustrating third modified shapes of the inner wall, the outer wall, and the jacket main body of the substrate processing apparatus according to the first embodiment of the present invention.

FIG. 9 illustrates third modified shapes of the inner wall 34, the outer wall 35, and the jacket main body 66.

In this modification, as described above, the inner surface 661 of the jacket main body 66 has the same curvature as the outer surface 340 of the inner wall 34. Therefore, the inner surface 661 of the jacket main body 66 can be brought into contact with the outer surface 340 of the inner wall 34 without any gap.

In addition, the outer surface 660 and the inner surface 661 of the jacket main body 66 have the same curvature. The curvature of the inner surface 351 of the outer wall 35 is larger than the curvature of the outer surface 660 of the jacket main body 66, thereby causing a gap (d) to be formed between the inner surface 351 of the outer wall 35 and the outer surface 660 of the jacket main body 66.

Therefore, in the third modification, uniform-heat blocks 82 configured according to the gap (d) are installed at the inner surface 351 of the outer wall 35, for example, at predetermined intervals.

Figure 10A:
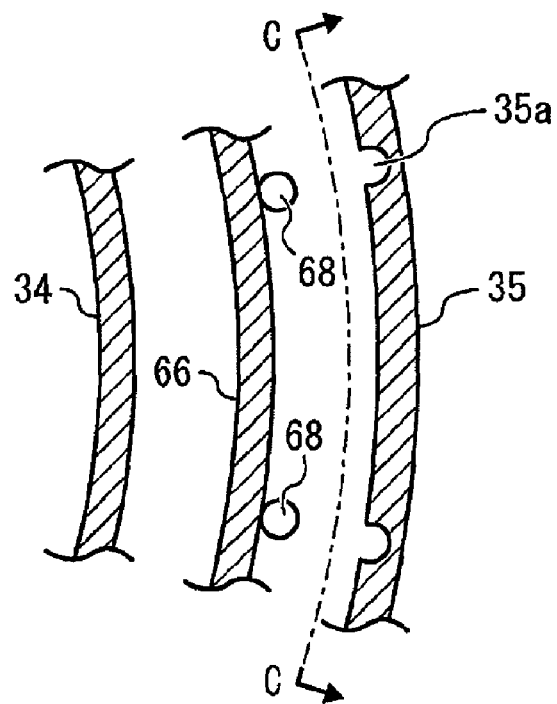
FIG. 10A and FIG. 10B illustrate a modified version of the outer wall of the substrate processing apparatus according to the first embodiment of the present invention.
Figure 10B:
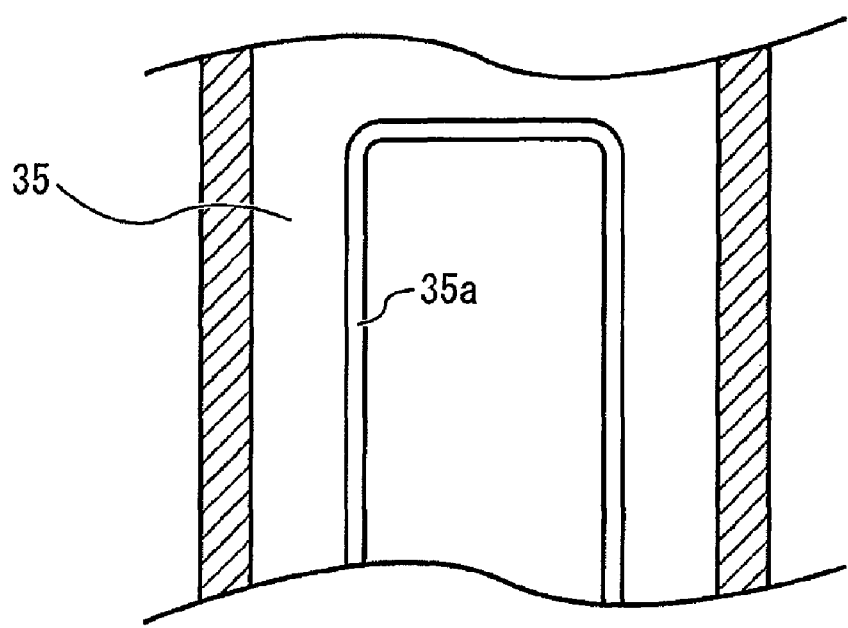

FIG. 10A and FIG. 10B illustrate a modified version of the outer wall 35.

In this modification, a concave part 35a is formed in the outer wall 35 for the pipe 68 mounted on the outer circumference of the jacket main body 66 of the water-cooling jacket 60. When the water-cooling jacket 60 is moved onto the outer wall 35, the pipe 68 installed on a surface of the jacket main body 66 facing the outer wall 35 is inserted into the concave part 35a. Therefore, as well as the pipe 68 of the water-cooling jacket 60, the water-cooling jacket 60 itself can be in contact with the outer wall 35.

Figure 11:
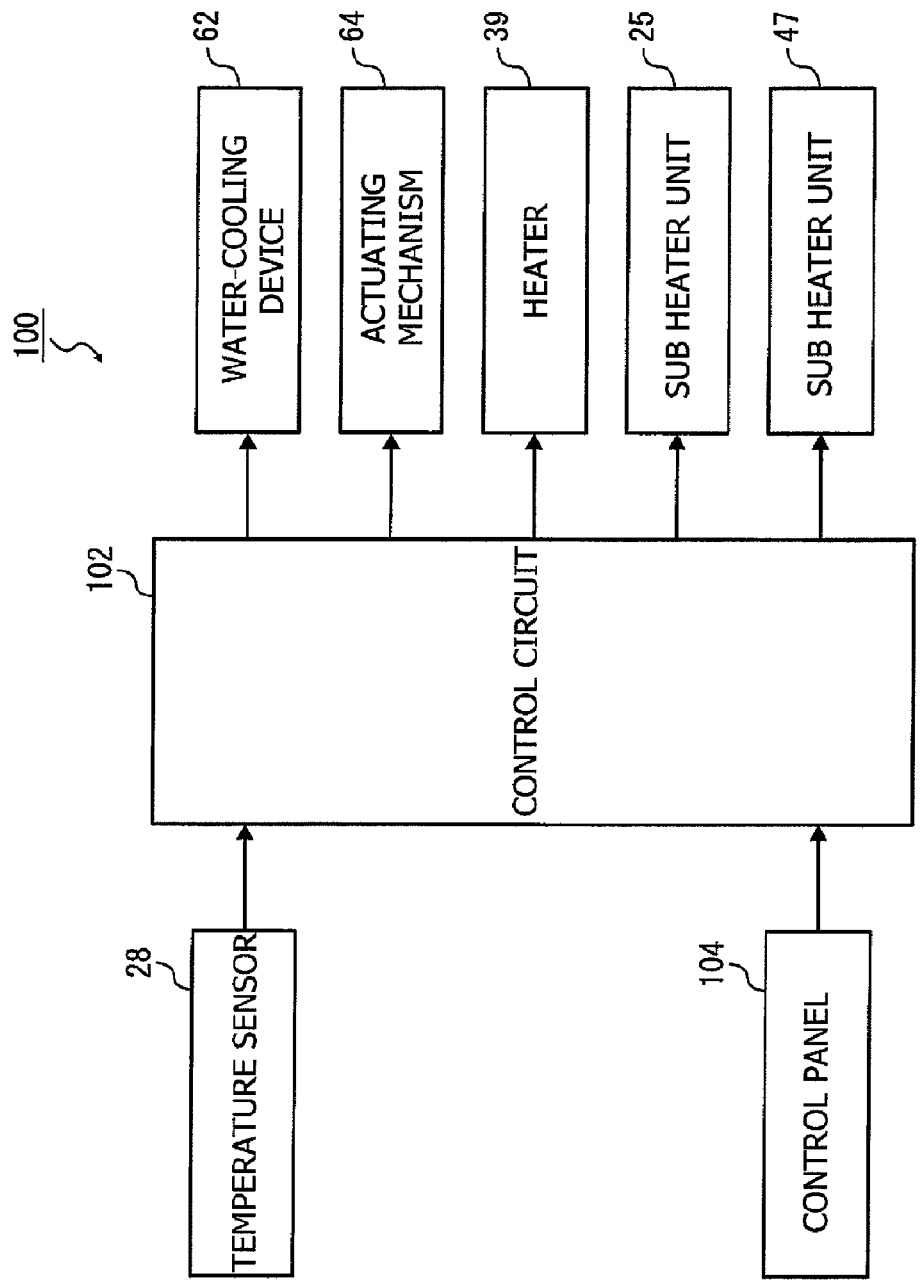
FIG. 11 is a block diagram illustrating a controller of the substrate processing apparatus according to the first embodiment of the present invention.

FIG. 11 illustrates a controller 100 of the substrate processing apparatus 10.

The controller 100 is used as a control unit for controlling at least the actuating mechanism 64, and the controller 100 includes a control circuit 102. An output signal of the temperature sensor 28 is transmitted to the control circuit 102, and at least the water-cooling device 62, the actuating mechanism 64, the heater 39, the sub heater unit 25, and the sub heater unit 47 are controlled using an output signal of the control circuit 102. In addition, an control panel 104 is installed at the control circuit 102 as a manipulation unit.

The above-described substrate processing apparatus 10 is controlled using the controller 100 according to processes such as a temperature raising process for raising the inside temperature of the process chamber 12 and the temperature of wafers 1 placed in the process chamber 12, a substrate processing process for processing the wafers 1 by stabilizing and maintaining the inside temperature of the process chamber 12 within a predetermined process temperature range, and a temperature lowering process for lowering the temperature of the process chamber 12. The control operation using the controller 100 is performed by considering the wavelength-temperature variation characteristics of the heater 39 and the thermal characteristics of wafers 1.

Figure 12:
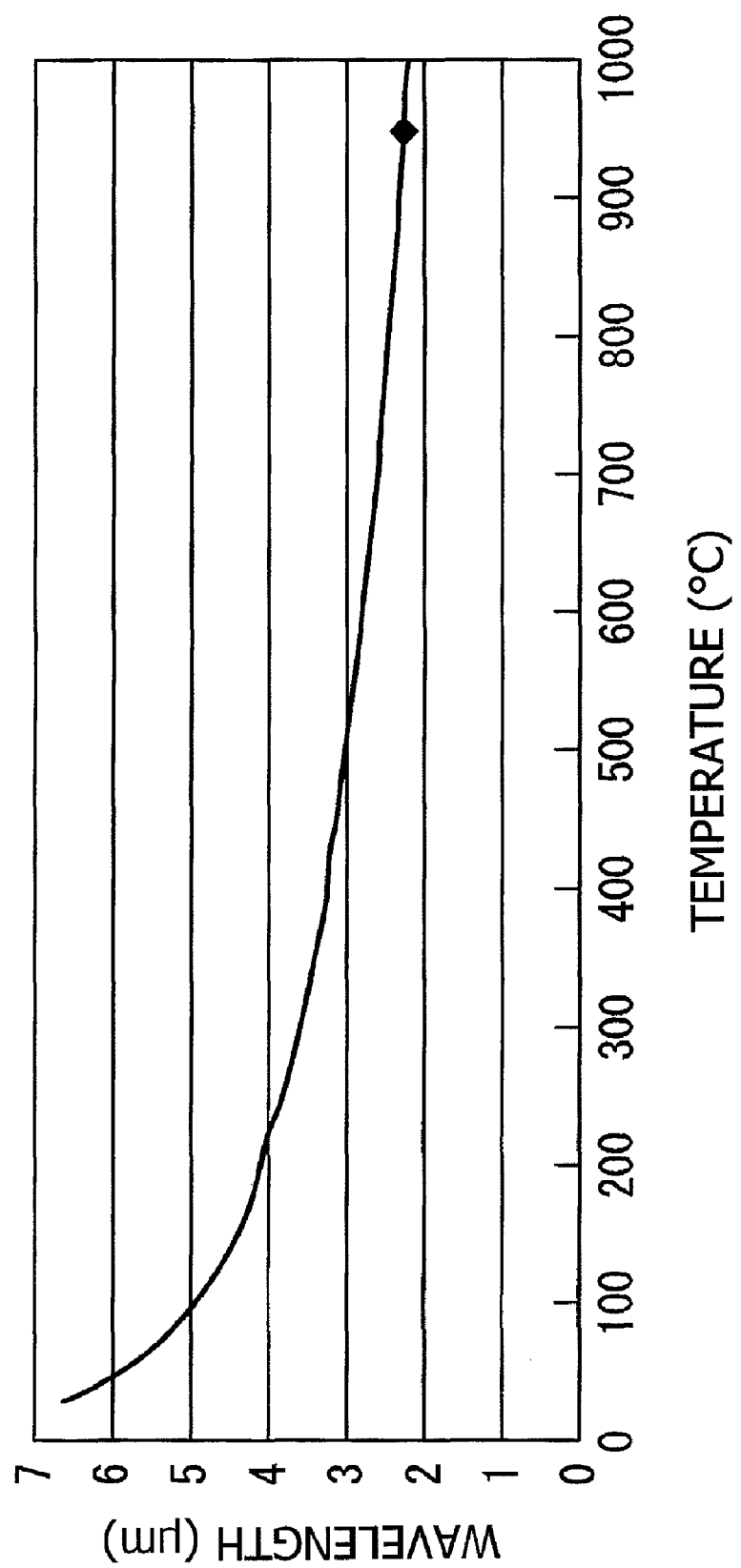
FIG. 12 is a graph showing the relationship between the peak wavelength and heating temperature of a heater of the substrate processing apparatus according to the first embodiment of the present invention.

FIG. 12 shows the relationship between the peak wavelength and heating temperature of the heater 39. In FIG. 12, the vertical axis denotes wavelength (μm), and the horizontal axis denotes temperature (° C.).

Figure 13:
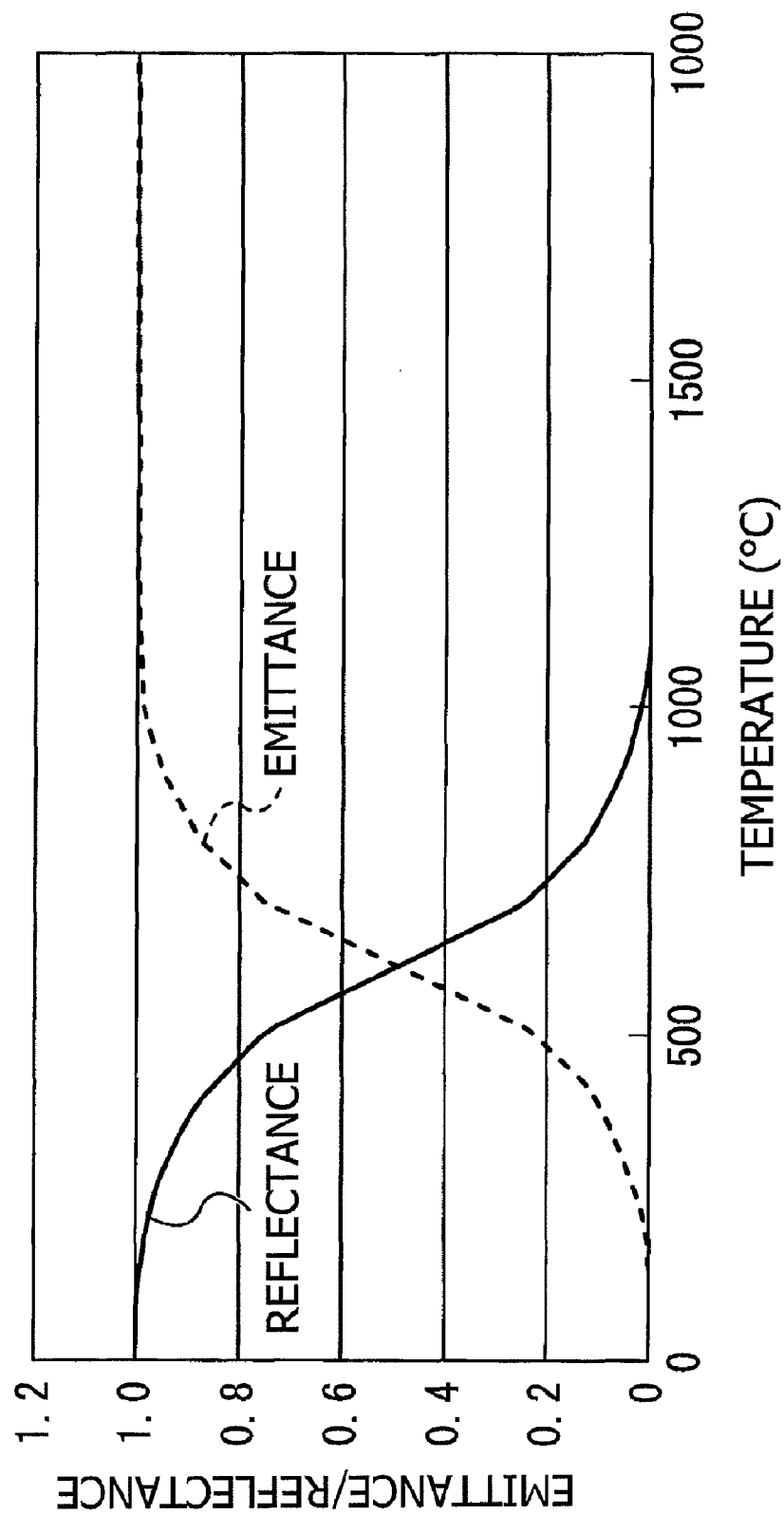
FIG. 13 is a graph showing thermal characteristics of a wafer processed in the substrate processing apparatus according to the first embodiment of the present invention.

FIG. 13 shows the thermal characteristics of a wafer 1 made of silicon: the heat reflecting characteristic (reflectance) and heat emitting characteristic (emittance) of the wafer is shown with respect to the temperature of the wafer 1. In FIG. 13, the vertical axis denotes the heat reflecting characteristic (reflectance) and heat emitting characteristic (emittance) of the wafer 1, and the horizontal axis denotes the temperature of the wafer 1.

As shown in FIG. 12, the wavelength of thermal radiation of a part such as the heater 39 is about 4 μm to about 6 μm at a low temperature range equal to or higher than about 50° C. but lower than about 250° C. In addition, the wavelength of thermal radiation is about 2.2 μm to about 4 μm at an intermediate temperature range equal to or higher than 250° C. but lower than about 500° C. and at a high temperature range equal to or higher than 500° C. but lower than 1050° C.

As shown in FIG. 13, the reflectance of the wafer 1 is high but the emittance (absorptance) of the wafer 1 is low at a low temperature range equal to or higher than about 50° C. but lower than about 250° C. Therefore, at such a temperature range, the wafer 1 does not absorb heat easily, and thus it is difficult to heat the wafer 1. On the other hand, at a temperature range equal to or higher than 250° C., the heat absorption rate of the wafer 1 increases in proportion to the increase of temperature.

In addition, the peak wavelength of thermal radiation at which the heat absorption rate of the wafer 1 is highest is about 0.9 μm. In addition, since the process tube 11 is made of quartz ($SiO_2$), the process tube 11 absorbs heat radiated at wavelengths equal to or higher than 4 μm, and thus it is difficult to increase the temperature of the wafer 1 by using heat radiation having a wavelength of 4 μm or higher.

When the above-described wavelength-temperature relationship of thermal radiation of the heater 39 and the thermal characteristics of the wafer 1 are considered, an effective way of heating the wafer 1 at a low temperature range is to increase the temperature of the heater 39 itself for shortening the wavelength of thermal radiation. That is, by maintaining the temperature of the heater 39 equal to or higher than 250° C. but lower than 1050° C. while keeping a temperature difference between the heater 39 and the surrounding of the heater 39, the wavelength of thermal radiation of the heater 39 can be in the range of about 2.2 μm to about 4 μm for facilitating heat absorption of the wafer 1. Cooling the inner wall 34 is an effective way of making the surrounding temperature of the heater 39 different from the temperature of the heater 39. However, if the inner wall 34 is excessively cooled in a temperature range equal to or higher than 500° C., the heating space 420 may be undesirably overcooled, and the power consumption of the heater 39 and the consumption of a cooling medium may be increased to lower the energy efficiency.

In a low temperature range equal to or higher than about 25° C. but lower than about 250° C., if a temperature raising process or a processing process is performed, the controller 100 increases the output power of the heater 39, and at the same time, the controller 100 controls the actuating mechanism 64 to bring the water-cooling jacket 60 into contact with the inner wall 34.

That is, in the low temperature range, if the peak wavelength of thermal radiation of the heater 39 is 4 μm to 6 μm, the peak wavelength is not readily absorbed by the wafer 1, and moreover, the process tube 11 made of quartz ($SiO_2$) absorbs the thermal radiation of the heater 39 having a wavelength of 4 μm or higher, thereby making it difficult to increase the temperature of the wafer 1.

Therefore, to shorten the peak wavelength of thermal radiation of the heater 39, the controller 100 increases the output power of the heater 39, and at the same time, the controller 100 cools the inner wall 34 by bringing the water-cooling jacket 60 into contact with the inner wall 34. In addition, since the water-cooling jacket 60 is brought into contact with the inner wall 34, the possibility of temperature overshoot (the case where temperature increases higher than a set temperature) can be decreased, and the controllability can be improved, and the temperature stabilizing time can be reduced. In addition, when a substrate is processed in the process chamber 12 by supplying process gas to the process chamber 12, the process can be performed at a stable temperature, and the uniformity of film thickness or quality of the processed substrate can be improved.

In the related art, since the process tube 11 forming the process chamber 12 has a predetermined thermal capacity, sufficient braking effect may not be exerted on the change of temperature due to thermal radiation from the process tube 11, and thus temperature overshoot may be caused. To solve this problem, the integral action of proportional integral derivative (PID) controlling (feedback controlling) may be fixedly patterned; however, it is still difficult to suppress temperature overshoot. However, in the substrate processing apparatus 10 relevant to an embodiment of the present invention, the water-cooling jacket 60 is moved to control cooling rapidly and finely and suppress temperature overshoot.

Furthermore, in a low temperature range equal to or higher than 25° C. but lower than 250° C., if a temperature lowering process is performed, the controller 100 brings the water-cooling jacket 60 into contact with the inner wall 34 so that a temperature lowering time necessary for lowering the inside temperature of the process chamber 12 can be reduced.

Furthermore, in an intermediate temperature range equal to or higher than 250° C. but lower than 500° C., if a temperature raising process is performed, the controller 100 increases the output power of the heater 39, and at the same time, the controller 100 brings the water-cooling jacket 60 into contact with the inner wall 34 to cool the inner wall 34, so as to further shorten the peak wavelength of thermal radiation of the heater 39. In addition, by bringing the water-cooling jacket 60 into contact with the inner wall 34, the possibility of temperature overshoot can be reduced, and controllability can be improved.

In this way, generation of temperature overshoot which is not easily suppressed by only PID control (feedback control) can be suppressed because rapid and fine cooling is possible by moving the water-cooling jacket 60.

Furthermore, in an intermediate temperature range equal to or higher than 250° C. but lower than 500° C., if a processing process is performed, the controller 100 stops cooling of the inner wall 34 by controlling the water-cooling jacket 60 to be in a position where the water-cooling jacket 60 does not make contact with any one of the inner wall 34 and the outer wall 35, so as to prevent heat dissipation to the outside of the heater unit 30 which may increase with the increase of temperature. By this, the power consumption of the heater 39 can be reduced, and thus the energy efficiency can be improved. In addition, for example, a place such as a clean room where the substrate processing apparatus 10 is installed can be prevented from being heated, and thus, energy consumption for cooling such a place can be saved.

Furthermore, when a processing process is performed in an intermediate temperature range, the water-cooling jacket 60 may be brought into contact with the outer wall 35 instead of placing the water-cooling jacket 60 in a position where the water-cooling jacket 60 does not make contact with any one of the inner wall 34 and the outer wall 35. In this case, since heat dissipation to the outside of the heater unit 30 can be further reduced, the power consumption of the heater 39 can be reduced, and the energy efficiency can be improved. In addition, for example, a place such as a clean room where the substrate processing apparatus 10 is installed can be further easily prevented from being heated, and thus, energy consumption for cooling such a place can be further saved.

Furthermore, in an intermediate temperature range equal to or higher than 250° C. but lower than 500° C., if a temperature lowering process is performed, the controller 100 brings the water-cooling jacket 60 into contact with the inner wall 34 so as to decrease the inside temperature of the process chamber 12 rapidly.

Furthermore, in a high temperature range equal to or higher than 500° C. but lower than 1050° C., if a temperature raising process is performed, the controller 100 places the water-cooling jacket 60 in a position where the water-cooling jacket 60 does not make contact with any one of the inner wall 34 and the outer wall 35 in order to maintain the output power of the heater 39 and the inside temperature of the process chamber 12 at high levels. By this, the power consumption of the heater 39 can be reduced, and the energy efficiency can be improved. In addition, for example, a place such as a clean room where the substrate processing apparatus 10 is installed can be prevented from being heated, and thus, energy consumption for cooling such a place can be saved.

Instead of placing the water-cooling jacket 60 in a position where the water-cooling jacket 60 does not make contact with any one of the inner wall 34 and the outer wall 35, the water-cooling jacket 60 may be brought into contact with the outer wall 35. In this case, since heat dissipation to the outside of the heater unit 30 can be further reduced, the power consumption of the heater 39 can be reduced, and the energy efficiency can be improved. In addition, for example, a place such as a clean room where the substrate processing apparatus 10 is installed can be prevented from being heated, and thus, energy consumption for cooling such a place can be saved.

Furthermore, in a high temperature range equal to or higher than 500° C. but lower than 1050° C., if a processing process is performed, the controller 100 controls the actuating mechanism 64 to bring the water-cooling jacket 60 into contact with the outer wall 35. By brining the water-cooling jacket 60 into contact with the outer wall 35, heat dissipation to the outside of the substrate processing apparatus 10 can be reduced, and for example, a place such as a clean room where the substrate processing apparatus 10 is installed can be prevented from being heated, thereby reducing energy consumption necessary for cooling the place.

Furthermore, in a high temperature range equal to or higher than 500° C. but lower than 1050° C., if a temperature lowering process is performed, the controller 100 brings the water-cooling jacket 60 into contact with the inner wall 34 to lower the temperature of the process chamber 12 rapidly.

The upper limit of a high temperature range is set to about 1050° C. in the current embodiment using a diffusion furnace, and it may be set to about 850° C. in the case of using a chemical vapor deposition (CVD) furnace, so as to prevent thermal deterioration of members having a low heat-resistant temperature such as an O-ring. However, if thermal deterioration of such members having a low heat-resistant temperature can be prevented, the upper limit of the high temperature range can be set to 1050° or higher.

Next, an explanation will be given on a method of manufacturing a semiconductor device such as an integrated circuit (IC) device using the substrate processing apparatus 10.

The semiconductor device manufacturing method using the substrate processing apparatus 10 includes: a process in which the water-cooling jacket 60 disposed at a space between the annular inner wall 34 installed around the outer periphery of the heater 39 configured to heat the process chamber 12 and the annular outer wall 35 installed around the outer periphery of the inner wall 34 is moved to a position contacting the inner wall 34 by using the actuating mechanism 64 configured to move the water-cooling jacket 60 between a contacting position where the water-cooling jacket 60 makes contact with at least one of the inner wall 34 and the outer wall 35 and a non-contacting position where the water-cooling jacket 60 does not make contact with any one of the inner wall 34 and the outer wall 35; and a process in which a wafer 1 is processed in the process chamber 12.

Hereinafter, more detailed descriptions will be given on processes of the semiconductor device manufacturing method using the substrate processing apparatus 10. In the following descriptions, each process is implemented by controlling each part of the substrate processing apparatus 10 using the controller 100.

In the semiconductor device manufacturing method, first, the boat 26 in which a plurality of wafers 1 are held and arranged is placed at a position for vertically arranging the wafers 1 on the seal cap 21. Next, the boat elevator (not shown) moves the boat 26 upward to load the boat 26 into the process chamber 12 through the furnace port 13 of the process tube 11 and set the boat 26 in the process chamber 12 in a state where the boat 26 is supported by the seal cap 21.

Next, the inside of the process chamber 12 is exhausted through the exhaust pipe 17 to a predetermined pressure and is heated by the heater 39.

Next, after the pressure and temperature of the process chamber 12 reach predetermined levels and stay stable at the predetermined levels, process gas is introduced into the process chamber 12 through the gas introducing pipe 18 at, for example, a predetermined flow rate for processing the wafers 1.

Next, after a predetermined process time (for example, after introduction of the process gas is stopped), purge gas such as nitrogen gas is introduced into the process chamber 12 through the gas introducing pipe 18, and at the same time, the inside of the process chamber 12 is exhausted through the exhaust pipe 17. In addition, cooling air 41 is supplied to the air passage 15 between the process tube 11 and the uniform heat tube 14, the cooling air passage 42 between the uniform heat tube 14 and the insulating vessel 33, and the space 36 of the insulating vessel 33, so as to cool the process chamber 12 by circulating the purge gas.

Next, after the temperature of the process chamber 12 reduces to a predetermined level, the boat 26 is moved downward by the boat elevator (not shown) in a state where the boat 26 is supported by the seal cap 21 and is unloaded from the process chamber 12 through the furnace port 13. Thereafter, the above-described processes are repeated to process next wafers 1 using the substrate processing apparatus 10.

Among the above-described processes, at least from a process for raising the temperature of the process chamber 12 to a process for lowering the temperature of the process chamber 12, the water-cooling jacket 60 is moved to a predetermined position according to the inside temperature of the process chamber 12. Hereinafter, an operation (movement) of the water-cooling jacket 60 will be described, for example, in the case where the inside temperature of the process chamber 12 is equal to or higher than 25° C. but lower than 250° C.

The water-cooling jacket 60 is placed in contact with the inner wall 34 during a process (temperature raising process) where the output power of the heater 39 is increased to increase the temperature of the process chamber 12 or a process (processing process) where the temperature of the process chamber 12 is stably kept within a predetermined range for processing wafers 1. When the temperature of the inside of the process chamber 12 is in a range equal to or higher than 25° C. but lower than 250° C., if the wavelength of thermal radiation of the heater 39 ranges from 4 μm to 6 μm, the thermal radiation of the heater 39 is not easily absorbed by the wafers 1, and moreover, the process tube 11 made of quartz (SiO$_2$) absorbs thermal radiation of the heater 39 having a wavelength equal to or higher than 4 μm, thereby making it difficult to increase the temperature of the wafers 1. For this reason, the water-cooling jacket 60 is brought into contact with the inner wall 34 to shorten the wavelength of thermal radiation of the heater 39 by cooling the inner wall 34.

In addition, during a process for cooling the process chamber 12, the water-cooling jacket 60 is placed in contact with the inner wall 34. By this, a temperature lowering time necessary for lowering the temperature of the process chamber 12 can be reduced.

Figure 14:
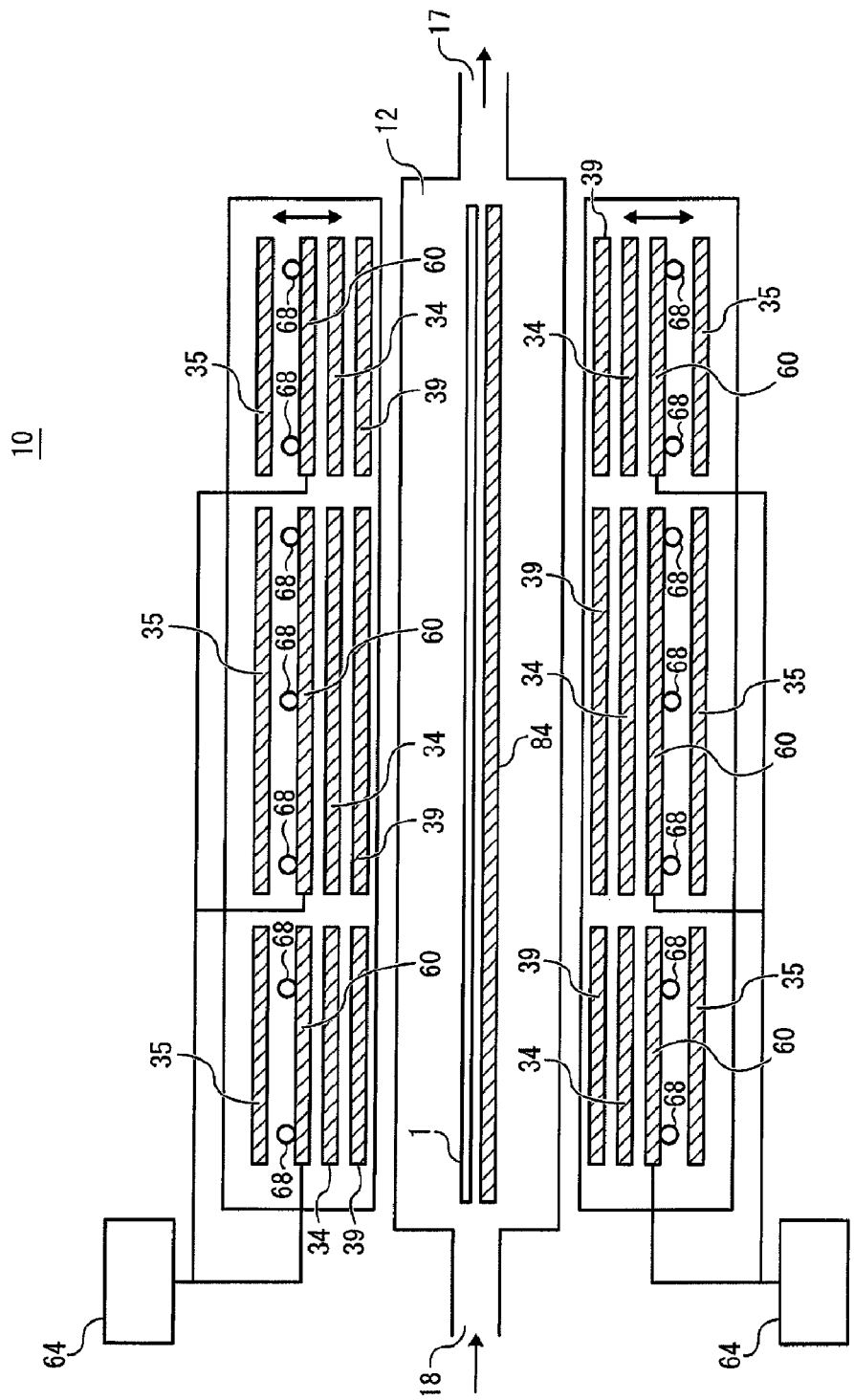
FIG. 14 is a schematic view illustrating a substrate processing apparatus according to a second embodiment of the present invention.

FIG. 14 is a schematic view illustrating a process chamber 12 according to a second embodiment of the present invention.

The above-described substrate processing apparatus 10 of the first embodiment is a batch type vertical substrate processing apparatus configured to process a plurality of wafers 1. On the other hand, a substrate processing apparatus 10 of the second embodiment is configured to process a wafer 1 in the process chamber 12.

That is, in the substrate processing apparatus 10 of the second embodiment, a wafer 1 is placed at a susceptor 84 installed in the process chamber 12 and is processed by gas introduced into the process chamber 12 through a gas introducing pipe 18.

Furthermore, in the substrate processing apparatus 10 of the first embodiment, the heater 39, the inner wall 34, the water-cooling jacket 60, and the outer wall 35 have a cylindrical shape. On the other hand, in the substrate processing apparatus 10 of the second embodiment, heaters 39, inner walls 34, water-cooling jackets 60, and outer walls 35 have a disk shape like a wafer 1.

In addition, in the substrate processing apparatus 10 of the first embodiment, the heater 39, the inner wall 34, the water-cooling jacket 60, and the outer wall 35 are coaxially arranged in this order in a direction from the inside to the outside. On the other hand, in the substrate processing apparatus 10 of the second embodiment, the heaters 39, the inner walls 34, the water-cooling jackets 60, and the outer walls 35 are vertically arranged. That is, the heaters 39, the inner walls 34, the water-cooling jackets 60, and the outer walls 35 are arranged in this order from the upper and lower sides of the process chamber 12.

Furthermore, in the substrate processing apparatus 10 of the first embodiment, the actuating mechanism 64 is configured to move the water-cooling jacket 60 having a cylindrical shape in a radial direction. On the other hand, in the substrate processing apparatus 10 of the second embodiment, the water-cooling jackets 60 are moved upward and downward.

That is, actuating mechanisms 64 move the water-cooling jackets 60 upward or downward among positions where the water-cooling jackets 60 make contact with the outer walls 35, positions where the water-cooling jackets 60 make contact with the inner walls 34, and positions where the water-cooling jackets 60 do not make contact with any one of the inner walls 34 and the outer walls 35. In FIG. 14, the water-cooling jackets 60 are placed in positions where the water-cooling jackets 60 do not make contact with any one of the outer walls 35 and the inner walls 34.

Besides the above-described differences, other structures and control operations of the substrate processing apparatus 10 of the second embodiment are the same as those of the substrate processing apparatus 10 of the first embodiment.

By using the substrate processing apparatus 10 of the first embodiment and the substrate processing apparatus 10 of the second embodiment, wafers 1 can be processed with good film quality and film thickness uniformity.

There are three modes of heat transfer: conduction, convection, and radiation, and for example, when a wafer 1 is processed in a low temperature range from about 50° C. to about 250° C., heating efficiency by radiation is decreased if PID control is used. This decrease in heating efficiency can be prevented by rapid heating, and thus high power is applied to a heating element such as the heater 39.

However, in this case, since the process tube 11 forming the process chamber 12 has a predetermined thermal capacity, sufficient braking effect may not be exerted on the change of temperature due to thermal radiation from the process tube 11, and thus temperature overshoot may occur during a transition from a temperature raising process to a temperature stabilizing process. This temperature overshoot can be prevented by preventing overheating of the heater 39 by using a control value calculated from a set valve and a measured value by using a PID control (feedback control) method; however, in this case, a long time is necessary for increasing temperature to, for example, 200° C. and stabilizing temperature at 200° C.

Moreover, in the integral action of PID calculation that causes overheating, optimal values may be calculated from previously obtained temperature characteristic results, and the optimal values may be set after patterning the optimal values, so as to attain obtain desired characteristics; however, although such a control method is used, temperature control can be impractical due to a region where the output value is zero. Therefore, in the related art, it is difficult to control the thermal history of a wafer 1, and thus the film quality and film thickness uniformity of the wafer 1 may be deteriorated.

However, in the substrate processing apparatuses 10 of the first and second embodiments, flexible reactions are possible according to the process temperature and heating temperature, and rapid and fine adjustment of thermal history is possible, so that wafers 1 can be processed with good film quality and film thickness uniformity.

In addition, in the substrate processing apparatuses 10 of the first and second embodiments, the water-cooling jacket 60 is installed as a part separate from the inner wall 34 and the outer wall 35, and the actuating mechanism 64 is used to move the water-cooling jacket 60 to a position where the water-cooling jacket 60 makes or does not makes contact with any one of the inner wall 34 and the outer wall 35. Therefore, when the water-cooling jacket 60 previously cooled by circulating cooling water through the pipes 68 is brought into contact with any one of the inner wall 34 and the outer wall 35, heat accumulated in one of the inner wall 34 and the outer wall 35 can be rapidly removed by heat conduction of solid parts.

Meanwhile, for example, when a wafer 1 is processed at a high temperature (e.g., 600° C.), after the temperature of the process chamber 12 is sufficiently increased, the water-cooling jacket 60 can be placed apart from the inner wall 34 and the outer wall 35 so as to process the wafer 1 in the high-temperature process chamber 12 without heat transfer from the inner wall 34 and the outer wall 35 to the water-cooling jacket 60.

In the substrate processing apparatuses 10 of the first embodiment, instead of moving the water-cooling jacket 60 among a position not contacting any one of the inner wall 34 and the outer wall 35, a position contacting the inner wall 34, and a position contacting the outer wall 35, an insulating material installed as a replacement of the water-cooling jacket 60 may be vertically moved or rotated around the process chamber 12 for obtain the same effect.

However, in the case of moving the insulating material vertically or rotating the insulating material around the process chamber 12, heat accumulated in the insulating material may not be effectively removed due to relatively large thermal capacity of the insulating material, and thus it takes long time to decrease the temperature of the process chamber 12. Therefore, for example, when the temperature of the process chamber 12 is lowered from a predetermined process temperature to a temperature suitable for unloading a wafer 1 from the process chamber 12, it may be difficult to increase the temperature lowering speed (temperature lowering rate) to a level of the temperature lowering rate of the substrate processing apparatuses 10 of the first embodiment.

According to the present invention, the substrate processing apparatus and the semiconductor device manufacturing method, the inside of the process chamber can be rapidly cooled.

Although the present invention is characterized by the appended claims, the present invention also includes the following embodiments.

(Supplementary Note 1)

According to an embodiment of the present invention, there is provided a substrate processing apparatus comprising: a process chamber configured to process a substrate; a heating element installed at a peripheral side of the process chamber to heat the process chamber; an annular inner wall installed at a peripheral side of the heating element; an annular outer wall installed at a peripheral side of the inner wall with a space being formed therebetween; an annular cooling member installed at the space for cooling; an actuating mechanism configured to move the cooling member between a contacting position where the cooling member makes contact with at least one of the inner wall and the outer wall and a non-contacting position where the cooling member does not make contact with any one of the inner wall and the outer wall; and a control unit configured to control at least the actuating mechanism.

(Supplementary Note 2)

In the substrate processing apparatus of Supplementary Note 1, a surface of the cooling member facing the inner wall may have the same curvature as that of a surface of the inner wall facing the cooling member.

(Supplementary Note 3)

In the substrate processing apparatus of Supplementary Note 2, a surface of the cooling member facing the outer wall may have the same curvature as that of a surface of the outer wall facing the cooling member.

(Supplementary Note 4)

In the substrate processing apparatus of Supplementary Note 1, the control unit may control the cooling member according to at least one of a temperature inside the process chamber and a variation of the temperature.

(Supplementary Note 5)

In the substrate processing apparatus of Supplementary Note 1, when a substrate process temperature inside the process chamber is set to be equal to or higher than about 25° C. but lower than about 250° C., the control unit may control the actuating mechanism to bring the cooling member into contact with the inner wall.

(Supplementary Note 6)

In the substrate processing apparatus of Supplementary Note 5, if the substrate process temperature inside the process chamber is set to be equal to or higher than about 25° C. but lower than about 250° C., the control unit may control the actuating mechanism to bring the cooling member into contact with the inner wall during any one of the following processes: a process of increasing an inside temperature of the process chamber, a process of stabilizing an increased inside temperature of the process chamber, a process of processing a substrate in the process chamber, and a process of decreasing the inside temperature of the process chamber.

(Supplementary Note 7)

In the substrate processing apparatus of Supplementary Note 1, if a substrate process temperature inside the process chamber is set to be equal to or higher than about 25° C. but lower than about 500° C., during at least a process of increasing an inside temperature of the process chamber, the control unit may control the actuating mechanism to bring the cooling member into contact with the inner wall.

(Supplementary Note 8)

In the substrate processing apparatus of Supplementary Note 1, if a substrate process temperature inside the process chamber is set to from about 500° C. to about 1050° C., during at least a process of processing a substrate in the process chamber, the control unit may control the actuating mechanism to bring the cooling member into contact with the outer wall.

(Supplementary Note 9)

In the substrate processing apparatus of Supplementary Note 1, the actuating mechanism may move the cooling member in a direction perpendicular to a surface of the inner wall facing the cooling member.

(Supplementary Note 10)

In the substrate processing apparatus of Supplementary Note 1, at least the inner wall may be made of the same material as the heating element.

(Supplementary Note 11)

In the substrate processing apparatus of Supplementary Note 1, if a substrate process temperature inside the process chamber is higher than a predetermined temperature, the control unit may perform substrate processing by controlling the actuating mechanism to bring the cooling member into contact with the outer wall, and if the substrate process temperature inside the process chamber is lower than the predetermined temperature, the control unit may perform substrate processing by controlling the actuating mechanism to bring the cooling member into contact with the inner wall.

(Supplementary Note 12)

In the substrate processing apparatus of Supplementary Note 1, according to a temperature range of a plurality of predetermined temperature ranges in which a substrate process temperature inside the process chamber is kept, the control unit may control the actuating mechanism to place the cooling member at one of a position where the cooling member does not make contact with any one of the inner wall and the outer wall, a position where the cooling member makes contact with the inner wall, and a position where the cooling member makes contact with the outer wall.

(Supplementary Note 13)

In the substrate processing apparatus of Supplementary Note 1, according to a temperature variation state inside the process chamber and a temperature range of a plurality of predetermined temperature ranges in which a substrate process temperature inside the process chamber is kept, the control unit may control the actuating mechanism to place the cooling member at one of a position where the cooling member does not make contact with any one of the inner wall and the outer wall, a position where the cooling member makes contact with the inner wall, and a position where the cooling member makes contact with the outer wall.

(Supplementary Note 14)

According to another embodiment of the present invention, there is provided a heating device comprising: a heating element installed at an outer side of a process chamber to heat the process chamber; an inner wall installed at an outer side of the heating element; an outer wall installed at an outer side of the inner wall with a space being formed therebetween; a cooling member installed at the space for cooling; and an actuating mechanism configured to move the cooling member between a contacting position where the cooling member makes contact with the inner wall and a contacting position where the cooling member makes contact with the outer wall.

(Supplementary Note 15)

According to another embodiment of the present invention, there is provided a method of manufacturing a semiconductor device using an actuating mechanism configured to move an annular cooling member installed at a space between an annular inner wall installed at a peripheral side of a heating element configured to heat a process chamber and an annular outer wall installed at a peripheral side of the inner wall, the actuating mechanism being configured to move the cooling member between a contacting position where the cooling member makes contact with at least one of the inner wall and the outer wall and a non-contacting position where the cooling member does not make contact with any one of the inner wall and the outer wall, the method comprising: moving the cooling member to a contacting position by using the actuating mechanism to bring the cooling member into contact with the inner wall; and processing a substrate in the process chamber.

As described above, the present invention can be apparatus to a substrate processing apparatus configured to process a substrate such as a wafer, and a semiconductor device manufacturing method.

What is claimed is:

1. A substrate processing apparatus comprising:
a process chamber configured to process a substrate;
a heating element heating the process chamber, the heating element being provided to surround the process chamber;
an inner wall provided to surround the heating element;
an outer wall provided to surround the inner wall;
a cooling member disposed in a space between the inner wall and the outer wall;
an actuating mechanism configured to move the cooling member between a contacting position and a non-contacting position wherein the cooling member is in contact with at least one of the inner wall and the outer wall at the contacting position and the cooling member is not in contact with any of the inner wall and the outer wall at the non-contacting position; and
a control unit configured to control at least the actuating mechanism.

2. The substrate processing apparatus of claim 1, wherein a curvature of a surface of the cooling member facing the inner wall is same as that of a surface of the inner wall facing the cooling member.

3. The substrate processing apparatus of claim 2, wherein a curvature of a surface of the cooling member facing the outer wall is same as that of a surface of the outer wall facing the cooling member.

4. The substrate processing apparatus of claim 1, wherein the control unit controls the cooling member according to at least one of a temperature inside the process chamber and a variation of the temperature.

5. The substrate processing apparatus of claim 1, wherein the control unit controls the actuating mechanism to bring the cooling member into contact with the inner wall when a process temperature of the substrate inside the process chamber is set to be equal to or higher than 25° C. but lower than 250° C.

6. The substrate processing apparatus of claim 5, wherein the control unit controls the actuating mechanism to bring the cooling member into contact with the inner wall during any one of: increasing an inside temperature of the process chamber; stabilizing an increased inside temperature of the process chamber; processing the substrate in the process chamber; and decreasing the inside temperature of the process chamber when the process temperature of the substrate inside the process chamber is set to be equal to or higher than 25° C. but lower than 250° C.

7. The substrate processing apparatus of claim 1, wherein the control unit controls the actuating mechanism to bring the cooling member into contact with the inner wall when a process temperature of the substrate inside the process chamber is set to be equal to or higher than 25° C. but lower than 500° C. during at least increasing an inside temperature of the process chamber.

8. The substrate processing apparatus of claim 1, wherein the control unit controls the actuating mechanism to bring the cooling member into contact with the outer wall when a process temperature of the substrate inside the process chamber is set to be equal to or higher than 500° C. but equal to or lower than 1050° C. during at least processing the substrate in the process chamber.

9. The substrate processing apparatus of claim 1, wherein the actuating mechanism moves the cooling member in a direction perpendicular to a surface of the inner wall facing the cooling member.

10. The substrate processing apparatus of claim 1, wherein at least the inner wall and the heating element are made of a same material.

11. The substrate processing apparatus of claim 1, wherein the control unit controls the actuating mechanism to bring the cooling member into contact with the outer wall when a process temperature of the substrate inside the process chamber is higher than a predetermined temperature and the control unit controls the actuating mechanism to bring the cooling member into contact with the outer wall when the process temperature of the substrate inside the process chamber is lower than the predetermined temperature.

12. The substrate processing apparatus of claim 1, wherein the control unit controls the actuating mechanism according to a process temperature of the substrate inside the process chamber, the process temperature being in one of a plurality of predetermined temperature ranges, such that the actuating mechanism brings the cooling member into one of the non-contacting position, a contacting position where the cooling member is in contact with the inner wall, and a contacting position wherein the cooling member is in contact with the outer wall.

13. The substrate processing apparatus of claim 1, wherein the control unit controls the actuating mechanism according to a temperature variation inside the process chamber and a process temperature of the substrate inside the process chamber, the process temperature being in one of a plurality of predetermined temperature ranges, such that the actuating mechanism brings the cooling member into one of the non-contacting position, a contacting position with the inner wall, and a contacting position with the outer wall.

14. A heating device comprising:
a heating element heating a process chamber, the heating element being provided to surround the process chamber;
an inner wall provided to surround the heating element;
an outer wall provided to surround the inner wall;
a cooling member disposed in a space between the inner wall and the outer wall;
an actuating mechanism configured to move the cooling member between a contacting position where the cooling member is in contact with the inner wall and a contacting position wherein the cooling member is in contact with the outer wall.

15. A method of manufacturing a semiconductor device, comprising:
moving a cooling member disposed in a space between an inner wall provided to surround a heating element heating a process chamber and an outer wall provided to surround the inner wall using an actuating mechanism, the actuating mechanism being configured to move the cooling member between a contacting position and a non-contacting position wherein the cooling member is in contact with at least one of the inner wall and the outer wall at the contacting position and the cooling member is not in contact to with any of the inner wall and the outer wall at the non-contacting position; and
processing a substrate in the process chamber.

* * * * *